United States Patent [19]

Hayashi

[11] Patent Number: 4,629,356
[45] Date of Patent: Dec. 16, 1986

[54] SECURING UNIT

[75] Inventor: Yoshitoki Hayashi, Aichi, Japan

[73] Assignee: Kitagawa Industries Co., Ltd., Nagoya, Japan

[21] Appl. No.: 508,913

[22] Filed: Jun. 29, 1983

[30] Foreign Application Priority Data

Jul. 14, 1982 [JP] Japan .............................. 57-106564[U]

[51] Int. Cl.⁴ .............................................. F16B 21/08
[52] U.S. Cl. .............................. 403/408.1; 403/405.1; 403/167; 411/508; 174/138 D; 24/297; 248/73
[58] Field of Search ................. 403/408.1, 186, 405.1, 403/167; 24/297, 453, 573, 338, 326, 458, 616, 289; 248/73, 27.3, 221.4; 174/138 D; 411/508, 509, 510

[56] References Cited

U.S. PATENT DOCUMENTS

| | | | |
|---|---|---|---|
| 3,777,052 | 12/1973 | Fegen .............................. | 411/508 X |
| 3,811,154 | 3/1974 | Lindeman et al. ..................... | 24/326 |
| 3,836,703 | 9/1974 | Coules .............................. | 411/508 X |
| 3,893,208 | 7/1975 | Yuda ........................... | 174/138 D X |
| 3,909,883 | 10/1975 | Fegen .............................. | 411/508 X |
| 4,200,900 | 4/1980 | McGeorge .................... | 174/138 D X |
| 4,261,151 | 4/1981 | Ito .................................. | 24/573 X |
| 4,297,769 | 11/1981 | Coules ............................ | 174/138 D |
| 4,373,826 | 2/1983 | Inamoto et al. ................... | 24/297 X |
| 4,422,222 | 12/1983 | Notoya ........................... | 411/508 X |
| 4,470,178 | 9/1978 | Matsui .............................. | 24/289 |

FOREIGN PATENT DOCUMENTS

| | | | |
|---|---|---|---|
| 2901213 | 7/1980 | Fed. Rep. of Germany ... | 174/138 D |
| 48-16063 | 5/1973 | Japan . | |
| 49-19261 | 2/1974 | Japan . | |
| 1271400 | 4/1972 | United Kingdom . | |
| 1578381 | 1/1978 | United Kingdom . | |
| 1541448 | 2/1979 | United Kingdom ........... | 174/138 D |
| 2125100 | 2/1984 | United Kingdom . | |
| 2125878 | 3/1984 | United Kingdom ................ | 403/408 |

Primary Examiner—Cornelius J. Husar
Assistant Examiner—Todd G. Williams
Attorney, Agent, or Firm—Oblon, Fisher, Spivak, McClelland & Maier

[57] ABSTRACT

A securing unit for securing at least two different substrates spaced apart at a predetermined distance comprising a first securing portion for securing a first base plate, a second securing portion which forms an arrow shaped head and for securing a second base plate, and a support base portion for supporting said first and second securing portions in which the height of the first securing portion of the securing unit has been remarkably reduced. With this construction, the projection of the first securing portion of the unit is not impaired when removing unnecessary remnants or solder or when cleaning the surface of the first base plate, while the securings of the base plates by the first and second securing portions of the securing unit according to the present invention has been remarkably increased.

7 Claims, 16 Drawing Figures

SECURING UNIT

BACKGROUND OF THE INVENTION (1) Field of the Invention

The present invention relates to a securing unit having first and second securing portions with particular structures capable of stably mounting or securing at least two base plates at a predetermined distance spaced apart.

(2) Description of Prior Art

In order to make effective use of space within an electronic apparatus, different panel or plates must be firmly secured within it—i.e., a print circuit board or boards on which previous electronic elements are mounted must be secured on the chassis of the apparatus in an insulating condition with a predetermined distance speed apart therebetween. For this purpose, securing means for retaining a constant parallel distance between the different base plates (i.e., the chassis and the print circuit board or boards) are normally used.

Conventionally in this case, however, at one end of a support member having a predetermined length as a securing member therefore there is provided a mounting member for grasping one base plate, and at the other end thereof there is provided means for securing the securing means having leg portions which secure the other base plate by inserting it into a fixing aperture formed at the other base plate in advance. In that case, since there are a number of lead wires within the electronic apparatus, they are to be fixed on one of the base plates in a bundled condition at one end thereof.

FIG. 1 shows a prior art securing unit proposed by the same applicant of this application, which has securing legs. In the figure, the unit comprises a first base plate 1, a detent piece 2 having an arc form in its cross section for the detention of the base plate 1 from one side thereof, a center linkage leg 3, an arrow shaped resilient detention member 8, right and left thick legs 4 and 5, and right and left thin linkage pieces 6 and 7 which connect the arrow shaped detention member 8 and the detent piece 2. The same structure having the same constructing elements mentioned above is also formed on the opposite portion of the securing unit, which are marked by reference numbers 2' through 9' with respect to the other base plate 1' spaced apart at a predetermined distance. As shown in FIG. 1, the arrow shaped resilient detention member 8 is inserted into a hole 9 on the base plate 1 with the base plate 1 being sandwiched or clamped by the detent piece 2 and the thick legs 4 and 5. The same is also applied to the opposite plate 1' by the similar constructing elements 2' through 9'.

However, in the securing unit according to the prior art, the arrow shaped resilient detention member 8 projecting outside of the base plate 1 was not smart in its appearance and was also somewhat bothersome because of the high projection of the arrow shaped resilient detention member 8 on the first base plate 1 which is normally the chassis. In addition, the securing of each base plate by the prior art securing unit was not sufficient.

SUMMARY OF THE INVENTION

It is therefore an object of the present invention to provide a securing unit in which the drawbacks mentioned above have been overcome.

It is another object of the present invention to provide a securing unit in which one of the arrow shaped resilient detention members projecting high on one side of the first base plate according to the prior art has been eliminated.

It is still another object of the present invention to provide a securing unit in which the height of one of the securing portions of the securing unit has been remarkably reduced so that the projection is not impaired when removing unnecessary remnants of solder or when cleaning the surface of the first base plate. Additionally, the securing of the base plates by the securing unit has been remarkably increased.

According to the present invention, one of the features thereof resides in the securing unit comprising a mounting member for grasping one base plate at one end of the base portion of a support member, resilient detent leg members capable of being resiliently deformable in the right and left directions and tapered toward the bottom ends or extremes thereof, a linkage member provided at the center of said resilient detent members and extending in the longitudinal direction of the support member, a resilient reverse detention member having a thin partially spherical surface and provided at the end of the linkage member, and vertical stepped portions between the resilient reverse detention member and the leg members for securing another base plate at the opposite end of the support member.

These and other objects, advantages and features of the present invention will be apparent from the following description with reference to the accompanying drawings.

DESCRIPTION OF THE PREFERRED EMBODIMENT

Figure 1:
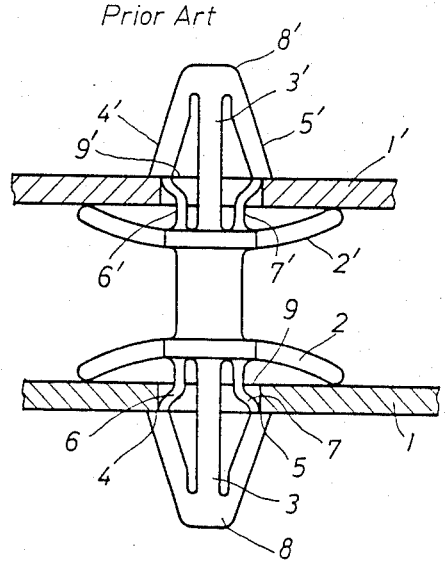
FIG. 1 is a securing unit according to the prior art, partially broken.

Referring to FIGS. 2 through 8, the securing unit 130 according to the present invention comprises a first securing portion 110 and a second securing portion 120. The first securing portion 110 comprises a first linkage member 14 having a certain thickness and a support base 20 having a ring shape with a certain thickness. The support base 20 is formed vertically above the center of the first linkage member 14. A pair of resilient detent leg members 18 each of which has a vertical stepped portion 26 at the bottom end thereof, and a resilient reverse detention member 16 has a think dish form or a partially spherical surface.

The resilient reverse detention member 16 is resiliently deformable in the longitudinal direction of the first linkage member 14 and is also formed in such a manner that a first base plate 22 having a rectangular aperture 24 (FIGS. 8 and 16) is secured from the outer surface thereof. The resilient detent leg members 18 having a rather broad width respectively are symmetrically formed at both sides of the first linkage member 14. The resilient detent leg members 18 are also resiliently deformable. The thickness of the two resilient detent leg members 18 increases toward the resilient reverse detention member 16 (i.e., the leg members 18 are tapered).

Between the first linkage member 14 and each of the resilient detent leg members 18, there is provided a bay 32 in order that the resilient detent leg members 18 can be easily deformed in the right and left directions when the securing unit 130 according to the present invention is inserted into the rectangular aperture 24 of the first base plate 22. The vertical stepped portions 26 are fitted into the rectangular aperture 24 (FIG. 8) of the first base plate 22. Each edge 28 of each resilient detent leg member 18 and the upper surface of the resilient reverse detention member 16 sandwich or clamp the first base plate 22. Accordingly, the gap or the distance between the edge 28 or bottom end of the resilient detent leg member 18 and the peripheral edge of the resilient reverse detention member 16 is slightly smaller than the thickness of the first base plate 22 so as to obtain the firm securing of the first base plate 22 by the resilient reverse detention member 16.

In addition, the distance between the vertical stepped portions 26 (i.e., the distance of the outer side 30 of each stepped portion 26) is formed broader than the internal length of the rectangular aperture 24 in the first base plate 22 so as to obtain the firm securing or mounting of the first base plate 22 due to the resiliency of the resilient detent leg members 18 when restoring its condition.

Figure 10:
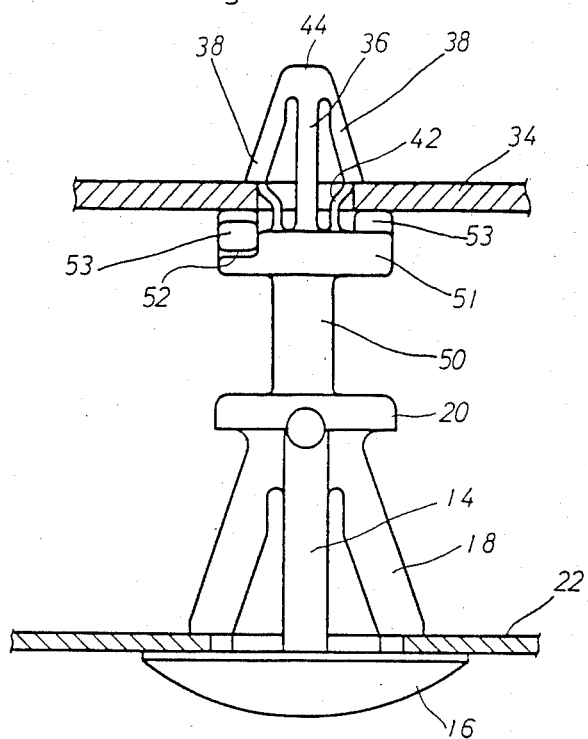
FIG. 10 is an elevational view of a second embodiment of the securing unit according to the present invention.
Figure 16:
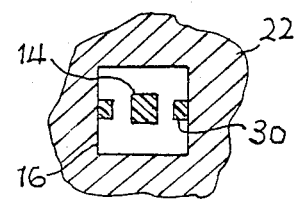
FIG. 16 is a cross-sectional view on the line XVI—XVI in FIG. 8.

Moreover, the size or length of the extreme of the resilient detent leg members 18 in the direction of width (i.e., in the perpendicular direction to the face of the drawing) is equal to or slightly smaller than that of the rectangular aperture 24 in the same direction. The outer diameter of the resilient reverse detention member 16 is larger than that of an imaginary circle circumscribing the rectangular apertures 24 in the first base plate 22. Accordingly, the first securing portion 110 of the securing unit 130 according to the present invention can be mounted to the first base plate 22 without backlash. To summarize, each resilient detent leg member 18 has (1) an abutment surface (i.e., the edge 28) which, as shown in FIG. 10, makes planar abutting contact with the side of the first base plate 22 opposite the resilient reverse detention member 16 and (2) an extension having a planar outer surface 30 which, as shown in FIG. 16, makes planar abutting contact with a planar side surface of a rectangular hole in the first base plate 22.

The second securing portion 120 comprises an arrow shaped head portion consisting of a second linkage member 36 having a suitable thickness and extending in the vertical direction to the support base 20. A pair of resilient reverse detent leg members 38 terminate in a pair of linkage pieces 42 connect the bottom ends of the resilient reverse detent leg members 38 and the surface of the support base 20.

Figure 8:
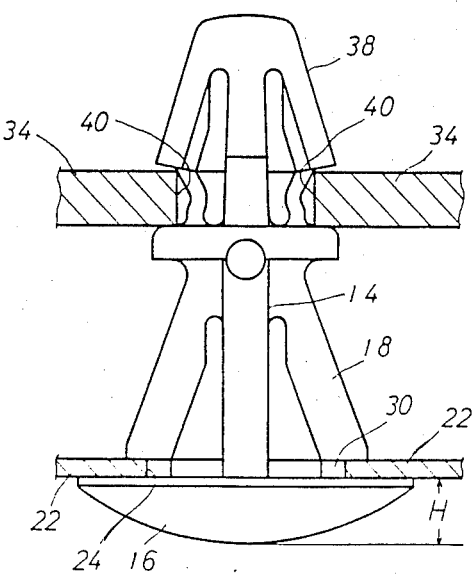
FIG. 8 is an elevational view of the securing unit according to the present invention, which is mounted to the holes of first and second base plates.
Figure 15:
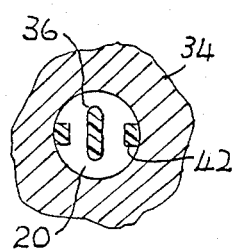
FIG. 15 is a cross-sectional view on the line XV—XV in FIG. 8.

The resilient reverse detent leg members 38 are tapered—i.e., the thickness of the two resilient reverse detent leg members 38 increases toward the bottom ends thereof, respectively. Between the second linkage member 36 at the center and each of the resilient reverse detent leg members 38, there is provided a bay 44 similar to the bays 32 of the first securing portion 110. The purpose of the bays 44 is to permit the resilient reverse detent leg members 38 to be readily deformed when the second securing portion 120 is inserted into a generally circular aperture 40 in a second base plate 34 (FIGS. 8 and 15).

Figure 4:
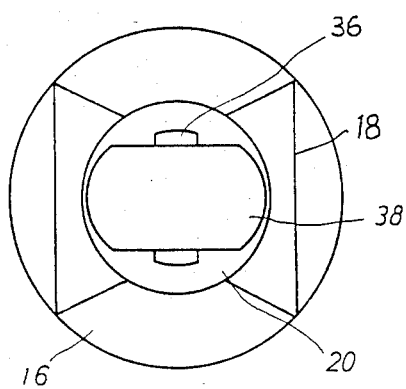
FIG. 4 is a top plan view of the securing unit of FIG. 2.
Figure 6:
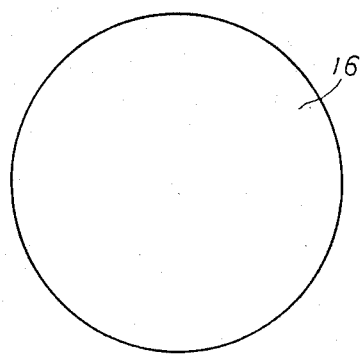
FIG. 6 is a bottom plan view of the securing unit of FIG. 2.
Figure 5:
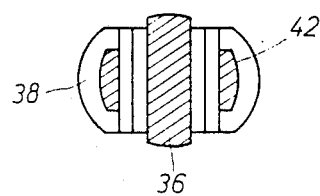
FIG. 5 is a cross sectional view of portions viewed from downward which is cut along the axis V—V in FIG. 2.
Figure 7:
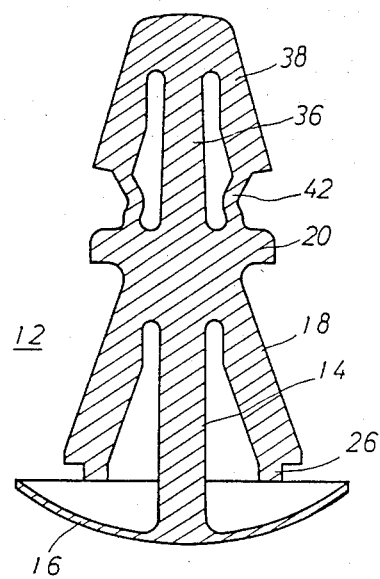
FIG. 7 is a cross sectional view of the securing unit according to the present invention cut along the axis VII—VII in FIG. 3.

At least the arrow shaped head portion consisting of the second linkage member 36, the resilient reverse detent leg members 38, and the linkage pieces 42 is integrally formed, although preferably all the elements of the securing unit 130 according to the present invention are integrally formed as shown in FIG. 7. The arrow shaped head portion (i.e., the second securing portion 120 of the securing unit 130) serves as resilient reverse detention means for sandwiching or clamping the second base plate 34 between the support base 20 and the bottom ends or edges of the resilient reverse detent leg members 38. The cross section of the resilient reverse detent leg members 38, the second linkage member 36, and the linkage pieces 42 which form the arrow shaped head portion is shown in FIG. 5. FIG. 4 shows the top view of the securing unit 130 according to the present invention.

The width of the extreme of each resilient reverse detent leg member 38 is slightly less than the circumference of the base portion of the support base 20. With this construction, the insertion of the resilient reverse detent leg members 38 into the ciruclar aperture 40 of the second base plate 34 can be easily done. In that case, the thin linkage pieces 42 are deformed in the right and left directions.

The distance between the bottom end portion of each resilient reverse detent leg member 38 and the support base 20 is approximately equal to the thickness of the second base plate 34 (FIG. 8) to be secured.

In such a manner as described, the second securing portion 120 of the securing unit 130 according to the present invention consists of the second linkage member 36, the resilient reverse detent leg members 38, the linkage pieces 42, and the support base 20 in order to secure the second base plate 34.

When mounting the securing unit 130 according to the present invention to the first and second base plates 22 and 34, the operation becomes as follows. First of all, the upper portion of the securing unit 130 is to be forcibly inserted into the rectangular aperture 24 of the first base plate 22 by pushing the resilient detent leg members 18 and deforming the same until the edges 28 of the resilient detent leg members 18 are completely penetrated through the rectangular aperture 24 of the first base plate 22. Then, the resilient detent leg members 18 resiliently expand to their original shapes or restore their original shapes, and the vertical stepped portions 26 are engaged with the inner wall of the rectangular aperture 24, with the first base plate 22 being securely sandwiched or clamped between the outer peripheral edge of the resilient reverse detention member 16 and the edges 28 of the resilient detent leg members 18.

After the first base plate 22 has been thus secured, the second base plate 34, the thickness of which is shown as being more thick than that of the first base plate, is to be secured. Namely, the upper portion or the second securing portion 120 of the securing unit 130 is forcibly inserted into the circular aperture 40 in the second base plate 34 until the bottom end portions or the edges of the resilient reverse detent leg members 38 are completely penetrated through the circular aperture 40 in the second base plate 34. Then, the second base plate 34 is securely sandwiched or clamped between the bottom end portions of the resilient reverse detent leg members 38 and the outer peripheral surface of the support base 20.

In the securing unit 130 according to the present invention, since the resilient reverse detention member 16 is formed as being a thin partially spherical surface, the height H (FIG. 8) of the projection from the outer surface of the first base plate 22 can be remarkably reduced, compared with the securing unit according to the prior art. Accordingly, when, for instance, removing or cleaning unnecessary remnants or solder attached on the outer surface of the first base plate 22, the top or outer surface of the resilient reverse detention member 16 is not impaired or damaged by a human hand. In the embodiment according to the present invention, the height of the projection of the resilient reverse member 16 is about 1.9 mm, which is less than half that of the prior art, so that the appearance of the electronic apparatus is improved, since no obstacles or hindrance to other electronic constructing elements occurs when mounting them. As the diameter of the resilient reverse detention member 16 is rather large (the diameter is about 10 mm in this embodiment) compared with the height H of the projection threof, a large contact area with the first base plate 22 can be obtained. Accordingly, a stable securing of at least two different base plates with at least two securing units according to the present invention can be obtained by a simple securing operation at a predetermined distance spaced apart.

Figure 9:
FIG. 9 is another embodiment of the portion marked with 16 in FIG. 2.

In the foregoing embodiment according to the present invention, the resilient reverse detention member 16 is shown as having a spherical surface. However, the surface may also be formed as shown in FIG. 9. That is, both sides of the spherical surface can be cut off as shown in FIG. 9 in order to reduce the outer area of the resilient reverse detention member 16'.

Moreover, in the embodiment according to the present invention, the distance between the outer periphery of the resilient reverse detention member 16 and the bottom edges 28 of the resilient detent leg members 18 for securing the first base plate 22 and the distance between the support base 20 and the bottom edges of the resilient reverse detent leg members 38 for securing the second base plate 34 are shown as being different than each other. However, it is apparent that the two distances can be made equal if the first and the second base plates to be secured have the same thickness.

Figure 2:
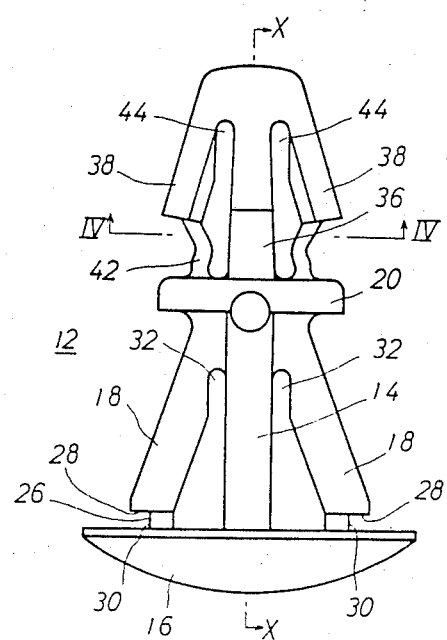
FIG. 2 is an elevational view of the securing unit according to the present invention.
Figure 3:
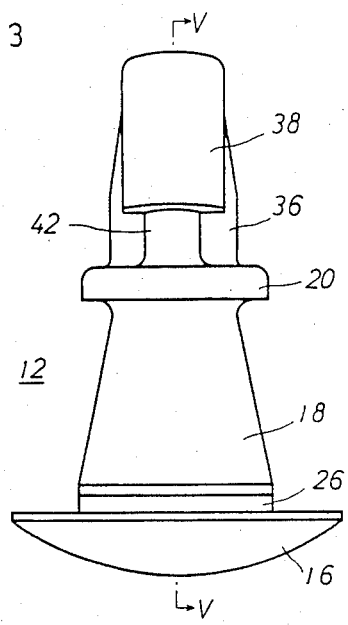
FIG. 3 is a side view of the securing unit according to the present invention.
Figure 11:
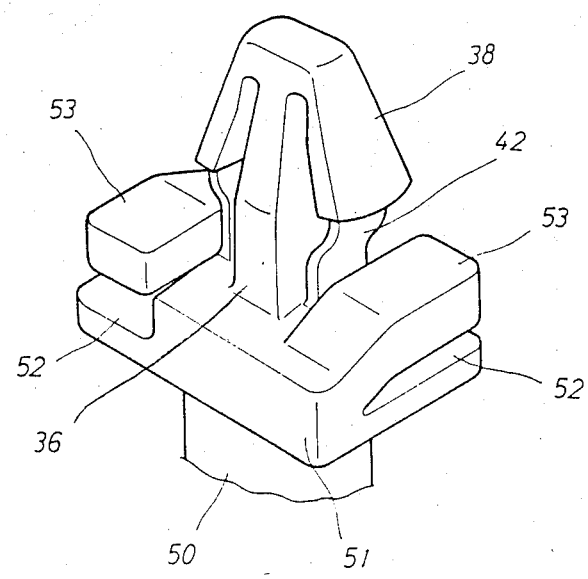
FIG. 11 is a perspective view of the upper portion of the securing unit according to the present invention in FIG. 10.

FIGS. 10 and 11 respectively show an elevational view and a perspective view of a second embodiment of the second securing portion 120 of the securing unit 130 according to the present invention. In the figures, the same reference numerals are attached to the same constructing elements as those shown in FIG. 2. In FIGS. 10 and 11, on the support base 20, there is provided a support extension 50 which has a pedestal 51 thereon which is preferably formed integrally with the support extension 50. The pedestal 51 carries the same arrow shaped head portion (i.e., the second securing portion 120) having the same second linkage member 36, the pair of resilient reverse detent leg members 38 on two sides of the second linkage member 36, and the linkage pieces 42 as shown in FIG. 2.

The pedestal 51 also has a pair of resilient pushing pieces 53 which are integrally formed with the pedestal 51. Each resilient reverse pushing piece 53 rises from the pedestal 51 wih a deep nothc 52 below the rise, for accommodating its resiliency. The risen end portions of the resilient reverse pushing pieces 53 face oppositely to each other, as better shown in FIG. 11. With this construction of the second embodiment according to the present invention, the second base plate 34 can be securely clamped between the bottom end portions of the resilient reverse detent leg members 38 and the upper surfaces of the two resilient reverse pushing pieces 53 due to the resiliency (i.e., the pushing force) of the resilient reverse pushing pieces 53 against the end portions. The lower first securing portion 110 of FIGS. 10 and 11 is the same as that shown in FIG. 2.

Figure 12:
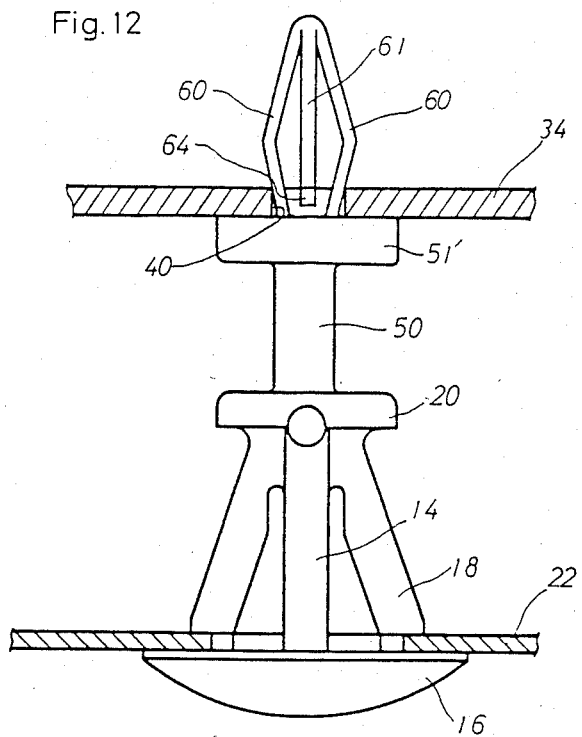
FIG. 12 is a third embodiment of the securing unit according to the present invention.
Figure 13:
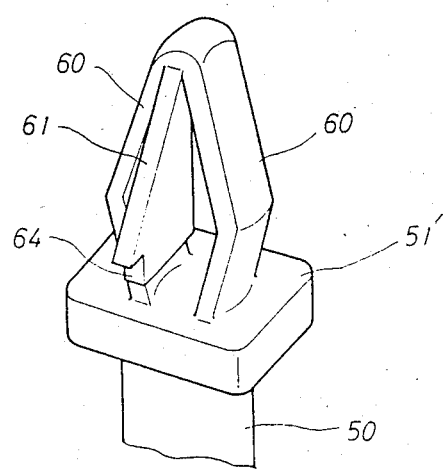
FIG. 13 is a perspective view of the upper portion of the securing unit according to the present invention in FIG. 12.

FIGS. 12 and 13 respectively show an elevational view and a perspective view of a third embodiment of the second securing portion 120 of the securing unit 130 according to the present invention. In the figures, the same reference numerals are attached to the same constructing elements which correspond to those shown in FIG. 2. In FIGS. 12 and 13, in this embodiment, instead of the arrow shaped head portion shown in FIG. 2 and FIG. 10, there is provided a second securing portion having rather thin resilient members 60 which are symmetrically bent toward the inner side thereof at the intermediate portion respectively. The second securing portion 120 having the thin resilient members 60 on the pedestal 51' has also a center plate member 61 having a notch 64 (FIG. 13) at the bottom portion thereof. The center plate member 61 is slanted toward the bottom end thereof as shown in FIG. 13.

With this construction, when the second securing portion 120 consisting of the thin resilient members 60 and the center plate member 61 is forcibly fitted into the circular aperture 40 in the second base plate 34, first the thin resilient members 60 are deformed and then they restore their shapes as they emerge from the circular aperture 40, while the notch portion 64 engages with the second base plate 34 at one portion. Consequently, the firm securing of the second base plate 34 can be obtained by the restoring action of the shape or expansion of the resilient members 60 together with the engagement of the notch 64 of the center plate member 61 with the second base plate 34. The lower first securing portion 110 of the securing unit 130 shown in FIGS. 12 and 13 is the same as the one shown in FIG. 2.

Figure 14:
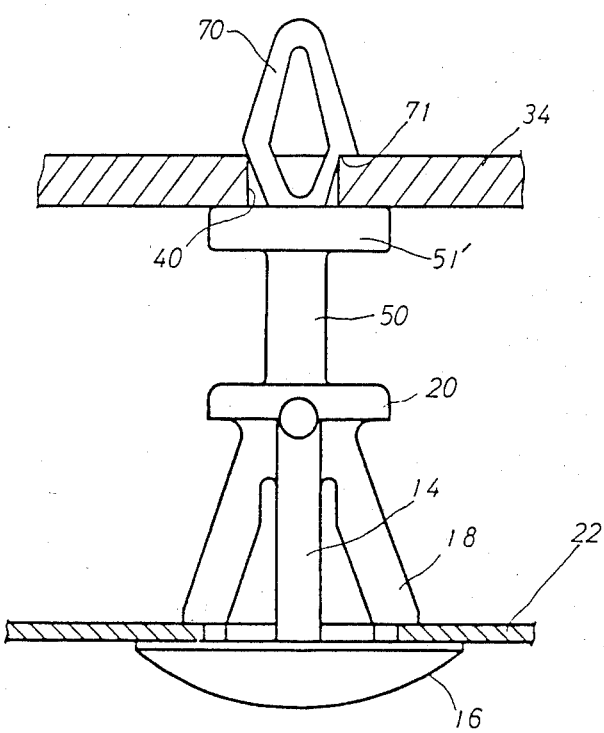
FIG. 14 is an elevational view of a fourth embodiment of the securing unit according to the present invention.

FIG. 14 shows a fourth embodiment of the second securing portion 120 of the securing unit 130 according to the present invention in which the same reference numerals are attached to the same constructing elements as those shown in FIG. 2. In this embodiment, rather thick resilient bent members 70 are formed on the pedestal 51'. The thick of one lower side of the resilient bent members 70 differs from the other lower side of the thick resilient bent members 70, and there is 71 at the thick bent portion. That is, the lower side of the thick resilient bent members 70 are not symmetrical to each other, as shown in FIG. 14. The existence of the notch 71 is for obtaining a better resilient deformation of the lower bent portion when the top of the thick resilient bent members 70 is inserted into the circular aperture 40 of the second base plate 34.

With this construction, the notch 71 of the thick resilient bent members 70 is engaged with the second base plate 34, when the second securing portion 120 of the securing unit 130 according to the present invention is inserted into the circular aperture 40 of the second base plate 34, and the second securing portion 120 having the thick resilient bent portion 70 and the notch 71 is prevented from an accidental pulling out of the circular aperture 40 due to the notch 71 after having been inserted into the circular aperture 40.

As described in the foregoing, in the securing unit according to the present invention, since the first resilient reverse detention member is formed in a thin dish having a partially spherical surface, the height of the projection from the outer surface of the first base plate can be remarkably reduced, compared with the securing unit according to the prior art. Accordingly, when for instance removing or cleaning unnecessary remants of solder attached on the outer surface of the first base plate, the top or the outer surface of the resilient reverse detention member is not impaired or damaged by a human hand or a tool for the cleaning.

Moreover, since the height of the projection of the resilient reverse detention member has been strikingly reduced, the appearance of the electronic apparatus carrhing these base plates and the securing units within it is improved. Also, no obstacles or hindrances to other electronic constructing elements occur when mounting them.

While the invention has been described in its preferred embodiments, it is to be understood that the words which have been used are words of description rather than limitation and that various changes and modifications may be made within the purview of the appended claims without departing from the true scope and spirit of the invention in its broader aspects.

What is claimed is:

1. A securing unit for holding two substrates at a fixed interval, a first one of said substrates having a rectangular aperture therethrough and the second one of said substrates having a circular aperture therethrough in alignment with the rectangular aperture in the first substrate, said securing unit comprising:

(a) a resilient reverse detention member having a working surface which, in use, bears resiliently against a first side of a first one of the two substrates;

(b) a first linkage member which extends in a first direction from said resilient reverse detention member, said first linkage member being perpendicular to the working surface of said resilient reverse detention member and, in use, extending through the rectangular aperture in the first substrate;

(c) a support base having a working surface which is sized, shaped, and positioned to make planar abutting contact with a first side of the second one of the two substrates, said support base being sized and shaped to pass through the rectangular aperture in the first substrate but not through the circular aperture in the second substrate;

(d) at least two resilient detent leg members which extend from said first linkage member towards said resilient reverse detention member, each of said at least two resilient detent leg members having an abutment surface which is sized, shaped, and positioned to make planar abutting contact with a second side, opposite to the first side, of the first substrate and an extension having a planar outer surface, said extension extending into the rectangular aperture in the first substrate and the planar outer surface of said extension being sized, shaped, and positioned to make planar abutting contact with a planar side surface of the rectangular aperture in the first substrate, said at least two resilient detent leg members being tapered inwardly in the first direction and being resiliently inwardly deformable by camming contact with the periphery of the rectangular aperture in the first substrate as said at least two resilient detent leg members pass through the rectangular aperture;

(e) a second linkage member which extends in the first direction from said support base, said second linkage member being perpendicular to the working surface of said support base;

(f) at least two resilient reverse detent leg members which extend in the first direction from said support base, each of said at least two resilient reverse detent leg members having an abutment surface which is sized, shaped, and positioned to bear against a second side, opposite to the first side, of the second substrate, said at least two resilient reverse detent leg members being tapered inwardly in the first direction and being resiliently inwardly deformable by camming contact with the periphery of the circular aperture in the second substrate as said at least two resilient reverse detent leg members pass through the circular aperture; and (g) a head portion, said second linkage member and said at least two resilient reverse detent leg members being attached to said head portion and said head portion being sized and shaped to pass through both the rectangular aperture in the first substrate and the circular aperture in the second substrate.

2. A securing unit as recited in claim 1 wherein the surface of said resilient reverse detention member remote from its working surface is partspherical in shape.

3. A securing unit as recited in claim 1 wherein said support base is ring-shaped.

4. A securing unit as recited in claim 1 wherein said head portion, said at least two resilient reverse detent leg members and said second linkage member together form an arrow-shaped portion of the securing unit.

5. A securing unit for holding two substrates at a fixed interval, a first one of said substrates having a first aperture therethrough and the second one of said substrates having a second aperture therethrough in alignment with the first aperture in the first substrate, said securing unit comprising:

(a) a resilient reverse detention member having a working surface which, in use, bears resiliently against a first side of a first one of the two substrates;

(b) a first linkage member which extends in a first direction from said resilient reverse detention member, said first linkage member being perpendicular to the working surface of said resilient reverse detention member and, in use, extending through the first aperture in the first substrate;

(c) a ring-shaped support base having an annular planar working surface which is sized, shaped, and positioned to make planar abutting contact with a first side of the second one of the two substrates, said ring-shaped support base being sized and shaped to pass through the first aperture in the first substrate but not through the second aperture in the second substrate;

(d) at least two resilient detent leg members which extend from said first linkage member towards said resilient reverse detention member, each of said at least two resilient detent leg members having an abutment surface which is sized, shaped, and positioned to make planar abutting contact with a second side, opposite to the first side, of the first substrate and an extension having an outer surface, said extension extending into the first aperture in the first substrate and the outer surface of said extension being sized, shaped, and positioned to make surface abutting contact with a side surface of the first aperture in the first substrate, said at least two resilient detent leg members being tapered inwardly in the first direction and being resiliently inwardly deformable by camming contact with the periphery of the first aperture in the first substrate as said at least two resilient detent leg members pass through the first aperture;

(e) a second linkage member which extends in the first direction from said ring-shaped support base, said second linkage member being perpendicular to the working surface of said ring-shaped support base;

(f) at least two resilient reverse detent leg members which extend in the first direction from said ring-shaped support base, each of said at least two resilient reverse detent leg members having an abutment surface which is sized, shaped, and positioned to bear against a second side, opposite to the first side, of the second substrate, said at least two resilient reverse detent leg members being tapered inwardly in the first direction and being resiliently inwardly deformable by camming contact with the periphery of the second aperture in the second substrate as said at least two resilient reverse detent leg members pass through the second aperture; and (g) a head portion, said second linkage member and said at least two resilient reverse detent leg members being sized and shaped to pass through both the first aperture in the first substrate and the second aperture in the second substrate.

6. A securing unit as recited in claim 5 wherein the surface of said resilient reverse detention member remote from its working surface is partspherical in shape.

7. A securing unit as recited in claim 5 wherein said head portion, said at least two resilient reverse detent leg members, and said second linkage member together form an arrow-shaped portion of the securing unit.

* * * * *